United States Patent
Cho et al.

(10) Patent No.: US 6,407,409 B2
(45) Date of Patent: Jun. 18, 2002

(54) METHOD AND APPARATUS FOR SINGLE CRYSTAL GALLIUM NITRIDE (GAN) BULK SYNTHESIS

(75) Inventors: Hak Dong Cho; Sang Kyu Kang, both of Cupertino, CA (US)

(73) Assignee: GAN Semiconductor, Inc., Sunnyvale, CA (US)

( * ) Notice: Subject to any disclaimer, the term of this patent is extended or adjusted under 35 U.S.C. 154(b) by 0 days.

(21) Appl. No.: 09/836,780

(22) Filed: Apr. 16, 2001

Related U.S. Application Data

(62) Division of application No. 09/478,954, filed on Jan. 7, 2000.
(60) Provisional application No. 60/115,177, filed on Jan. 8, 1999.

(51) Int. Cl.$^7$ ............................................. H01L 29/22
(52) U.S. Cl. ............................................. 257/78; 117/2
(58) Field of Search ........................... 257/79, 87, 101, 257/78; 438/46, 607, 22; 117/2

(56) References Cited

U.S. PATENT DOCUMENTS

| | | | | |
|---|---|---|---|---|
| 4,135,951 A | | 1/1979 | Stone | 148/1.5 |
| 4,144,116 A | * | 3/1979 | Jacob et al. | 156/611 |
| 5,633,192 A | | 5/1997 | Moustakas et al. | 438/46 |
| 5,677,538 A | | 10/1997 | Moustakas et al. | 250/370.12 |
| 5,679,152 A | * | 10/1997 | Tischler et al. | 117/97 |
| 5,919,305 A | * | 7/1999 | Solomon | 117/90 |
| 5,985,687 A | | 11/1999 | Bowers et al. | 438/46 |
| 6,156,581 A | | 12/2000 | Vaudo et al. | 438/22 |
| 6,177,688 B1 | * | 1/2001 | Linthicum et al. | 257/77 |
| 6,218,280 B1 | * | 4/2001 | Kryliouk et al. | 438/607 |

FOREIGN PATENT DOCUMENTS

DE 24 33 991 2/1976

OTHER PUBLICATIONS

Popovici, G., "Transmutation Doping of III–Nitrides", *Mat.Res.Soc.Symp.Proc.*, vol. 572, Apr. 1999, Material Research Society, pp. 519–522.

Schmidt, N. et al., "Effect of Annealing On Defects in As–Grown and γ–Ray Irradiated n–GaN Layers", *Physica Status Solidi B*, vol. 216, No. 1, Nov. 1999, pp. 533–536.

* cited by examiner

*Primary Examiner*—Hoai V. Ho
*Assistant Examiner*—Tu-Tu Ho
(74) *Attorney, Agent, or Firm*—Wilson Sonsini; Kenta Suzue

(57) ABSTRACT

A method and apparatus for homoepitaxial growth of freestanding, single bulk crystal Gallium Nitride (GaN) are provided, wherein a step of nucleating GaN in a reactor results in a GaN nucleation layer having a thickness of a few monolayers. The nucleation layer is stabilized, and a single bulk crystal GaN is grown from gas phase reactants on the GaN nucleation layer. The reactor is formed from ultra low oxygen stainless steel.

34 Claims, 3 Drawing Sheets

METHOD AND APPARATUS FOR SINGLE CRYSTAL GALLIUM NITRIDE (GAN) BULK SYNTHESIS

CROSS REFERENCE TO RELATED APPLICATIONS

This application is a Divisional of U.S. application Ser. No. 09/478,954 filed Jan. 7, 2000, which claims the benefit of U.S. Provisional Application 60/115,177 filed Jan. 8, 1999. These applications are incorporated herein by reference in their own entirety.

BACKGROUND OF THE INVENTION

1. Field of the Invention

This invention relates to the field of materials science and more particularly to the growth of semiconductor crystals.

2. Description of the Related Art

There is currently a demand in the computer and telecommunication industries for multicolor light emitting displays and improved data density in communication and recording. As a result of this demand, there is a strong desire for a semiconductor light emitting element capable of emitting light having shorter wavelengths ranging from a blue light wavelength to an ultraviolet wavelength.

The III–V nitrides, as a consequence of their electronic and optical properties and heterostructure character, are highly advantageous for use in the fabrication of a wide range of microelectronic structures. In addition to their wide band gaps, the III–V nitrides also have direct band gaps and are able to form alloys which permit fabrication of well lattice-matched heterostructures. Consequently, devices made from the III–V nitrides can operate at high temperatures, with high power capabilities, and can efficiently emit light in the blue and ultraviolet regions of the electromagnetic spectrum. Devices fabricated from III–V nitrides have applications in full color displays, super-luminescent light-emitting diodes (LEDs). high density optical storage systems. and excitation sources for spectroscopic analysis applications. Furthermore, high temperature applications are found in automotive and aeronautical electronics.

Effective use of these advantages of the III–V nitrides, however, requires that such materials have device quality and structure accommodating abrupt heterostructure interfaces. As such, the III–V nitrides must be of single crystal character and substantially free of defects that are electrically or optically active.

Gallium nitride (or GaN) is a particularly advantageous III–V nitride and attention has recently focused on gallium nitride related compound semiconductors (In(x)Ga(y)Al(1-x-yN) (0≦x, y; x+y≦1) as materials for emitting blue light. This nitride species can be used to provide optically efficient, high temperature, wide band gap heterostructure semiconductor systems having a convenient, closely matched heterostructure character. The direct transition type band structure of GaN permits highly efficient emission of light. Moreover, GaN emits light of shorter wavelength ranging from a blue light wavelength to an ultraviolet wavelength, due to a great band gap at room temperature of about 3.4 eV.

As no GaN substrates are currently found in the art, growth of these compounds must initially take place heteroepitaxially, for example GaN on silicon. However, heteroepitaxial growth has several technical drawbacks. In particular, two types of defects arise as a result of heteroepitaxial growth: (i) dislocation defects due to lattice mismatch; and (ii) dislocation defects due to different thermal coefficients between the substrate and the epitaxial layer.

The first type of defect includes dislocations due to the lattice mismatch between the GaN layer and the substrate. One typical substrate is sapphire. In the case where a gallium nitride related compound semiconductor crystal is grown on a sapphire substrate, a lattice mismatch up to approximately 16% is found between the GaN and the substrate. SiC is a closer lattice match, at an approximate lattice mismatch of 3%, but the mismatch is still quite large. Many other substrates have been used, but all of them have large lattice mismatches and result in a high density of defects in the grown layers.

The second type of defect includes dislocations generated during cool-down after growth. This defect is a result of different thermal coefficients of expansion of the substrate and epitaxial layer.

There are two typical methods in use for growing GaN compound semiconductor crystals. However, both suffer from deficiencies and/or limitations adversely affecting the quality of the GaN product. A first method uses a single crystalline sapphire as a substrate. A buffer layer is grown on the substrate for the purpose of relaxation of lattice mismatching between the sapphire substrate and the GaN compound semiconductor crystal. The buffer layer may be a AIN buffer layer or a GaAlN buffer layer. A GaN compound semiconductor crystal is grown in the buffer layer. While the buffer layers improve the crystallinity and surface morphology of the GaN compound semiconductor crystal, the crystal remains in a distorted state because of the lattice mismatch with the sapphire substrate. This distorted state results in dislocation defects described herein.

A second method attempts to reduce the lattice mismatch by providing a single crystal material as a substrate having a crystal structure and lattice constant that closely matches that of the GaN compound semiconductor crystal. One embodiment of this method uses aluminum garnet or gallium garnet as a substrate, but the lattice match using these compounds is not sufficient to provide much improvement. Another embodiment of this method uses substrate materials including MnO, ZnO, MgO, and CaO. While these oxides provide a better lattice match with the substrate, the oxides undergo thermal decomposition at the high temperatures required for the growth of the GaN compound semiconductor. Thermal decomposition of the substrate adversely affects the quality of the semiconductors obtained using this method.

As a result of these problems, typical GaN semiconductor devices suffer from poor device characteristics, short life span, and high cost. Full utilization of the properties of GaN semiconductors cannot be realized until a suitable substrate is available that allows for growth of high quality homoepitaxial layers. This requires development of processes for growth of the substrate material. For device applications, therefore, it would be highly advantageous to provide substrates of GaN, for epitaxial growth thereon of a GaN crystal layer. Thus, it would be a significant advance in materials science to provide GaN in bulk single crystal form, suitable for use as a substrate body for the fabrication of microelectronic structures.

SUMMARY OF THE INVENTION

A method and apparatus for homoepitaxial growth of freestanding, single bulk crystal Gallium Nitride (GaN) are provided. The fabrication method includes a step of nucleating GaN in a reactor at a temperature less than approximately 800 degrees Celsius and a pressure substantially in the range of $10^{-3}$ Torr to $10^{-6}$ Torr. This nucleation phase results in a first GaN structure, or GaN nucleation layer, having a thickness of a few monolayers. The nucleation layer is stabilized, and a single bulk crystal GaN is grown from gas phase reactants on the GaN nucleation layer in the reactor at a temperature substantially in the range of 450 degrees Celsius to 1250 degrees Celsius and a pressure substantially in the range of $10^{-3}$ Torr to atmosphere. The reactor is formed from ultra low oxygen stainless steel.

The descriptions provided herein are exemplary and explanatory and are provided as examples of the claimed invention.

BRIEF DESCRIPTION OF THE FIGURES

The accompanying drawings illustrate embodiments of the claimed invention. In the drawings:

DETAILED DESCRIPTION

Figure 1:
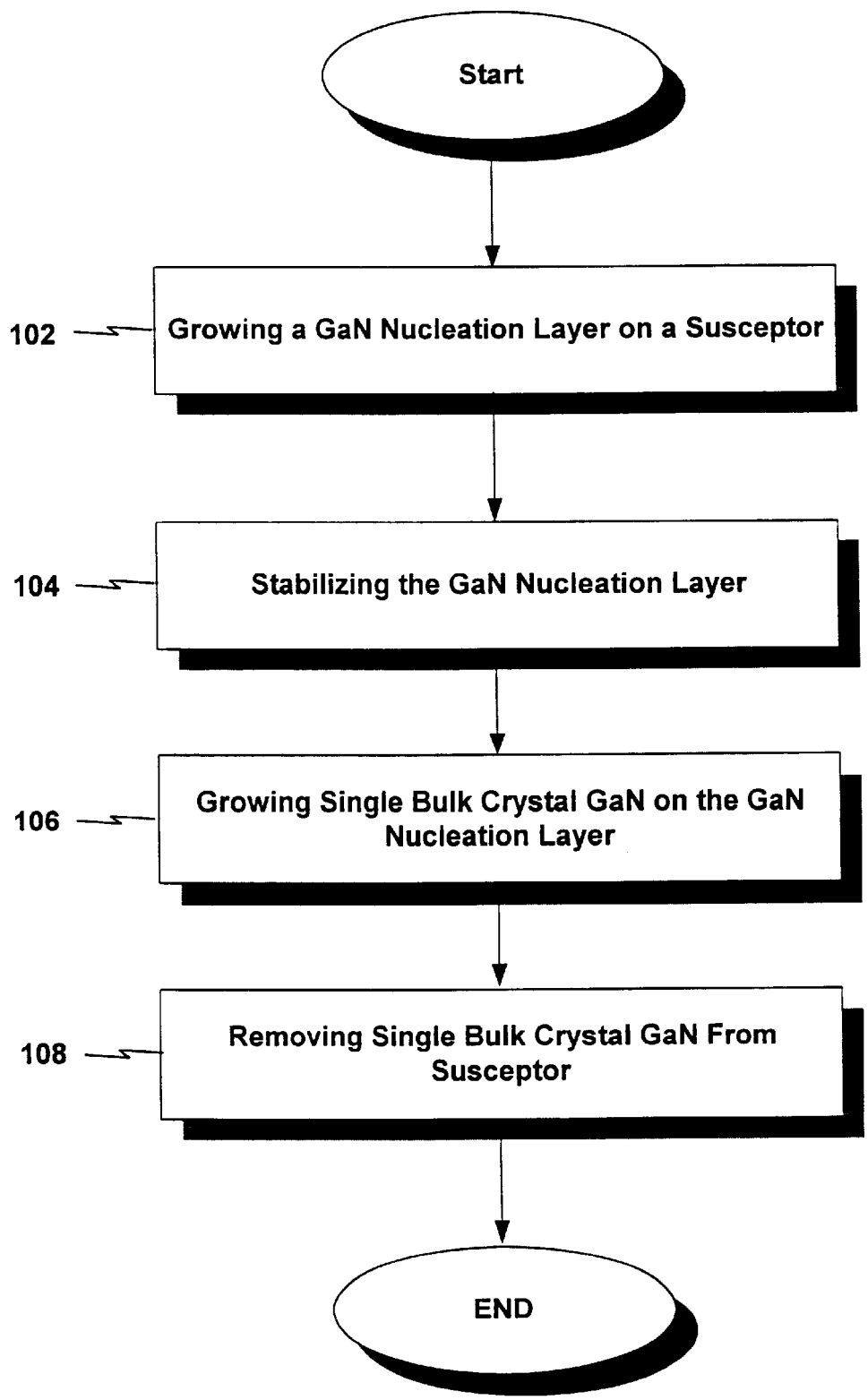
FIG. 1 is a flow chart of a method of growing freestanding, single bulk crystal Gallium Nitride (GaN) by homoepitaxy in an embodiment.
Figure 2:
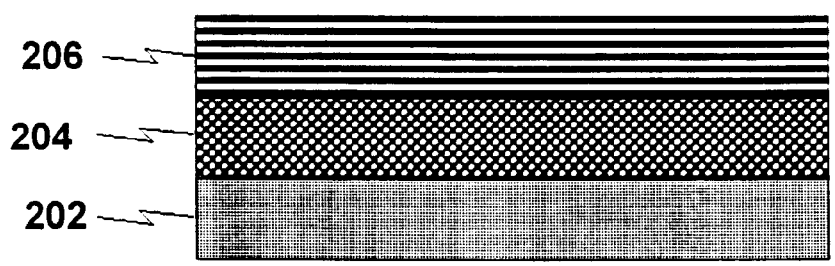
FIG. 2 is a side elevation diagram of a single bulk crystal GaN of an embodiment.

FIG. 1 is a flow chart of a method of growing freestanding, single bulk crystal Gallium Nitride (GaN) by homoepitaxy in an embodiment. FIG. 2 is a side elevation diagram of a single bulk crystal GaN of an embodiment. The fabrication begins at step 102, the step of nucleating GaN on a susceptor 202 in a reactor at a temperature less than approximately 800 degrees Celsius and a pressure substantially in the range of $10^{-3}$ Torr to $10^{-6}$ Torr. In various embodiments, the temperature can be in the range of 300 to 800° C., with a preferred range of 350 to 750° C. and specific embodiments of 400, 500 and 600° C. Similarly, the pressure can be in the range of $10^{-3}$ Torr to $10^{-5}$ Torr, with a preferred embodiment of $10^{-5}$ Torr. The nucleation step 102 results in a first GaN structure, or GaN nucleation layer 204, with a thickness of a few monolayers having a dimension thickness in the range of 10 to 70 Angstroms. In a preferred embodiment, nucleation layer 204 comprises ten monolayers with a thickness of 25 Angstroms.

The GaN nucleation layer 204 is stabilized, at step 104, and a single bulk crystal GaN 206 is grown from gas phase reactants on the GaN nucleation layer 204 in the reactor at a temperature substantially in the range of 450 degrees Celsius to 1250 degrees Celsius and a pressure substantially in the range of $10^{-3}$ Torr to atmospheric pressure, at step 106. The single bulk crystal GaN structure 204 and 206 is removed from the susceptor 202, at step 108. The reactor of an embodiment is formed from ultra low oxygen stainless steel.

By eliminating the need for a base substrate of different material, or non-GaN material, the method and apparatus described herein achieves markedly superior results. Dislocation deject densities are several orders of magnitude less than typical methods. Furthermore, this method permits the growth of crystals to thickness greater than 100 micrometers, several orders of magnitude greater than typical methods.

The freestanding single bulk GaN semiconductors produced using the technologies described herein can be used in a variety of optoelectronic devices, including blue and green light-emitting diodes (LEDs) and laser diodes (LDs). These semiconductors and the devices in which they are components are used in providing an enabling technology for a wide variety of consumer, computer, business, telecommunications and industrial products including, but not limited to, digital video disk (DVD) devices, audio compact disk (CD) devices, computer CD-ROM drives, optical data storage devices, laser printers, rewritable optical storage drives, barcode scanners, computer-to-plate digital printing presses, detectors, lasers for optical fiber communication, full color electronic outdoor displays, and flat panel displays. Furthermore, as three primary colors can be generated using GaN semiconductor materials, white light sources with adjustable mood coloring will become available using the freestanding single bulk GaN semiconductor devices described herein.

In an embodiment, a GaN semiconductor crystal is grown without a typical non-GaN base substrate. A three-step process is provided including a first step of creating a nucleation layer, a second step of an interconnection process, and a third step of growing a single crystal GaN layer on the nucleation layer.

Figure 3:
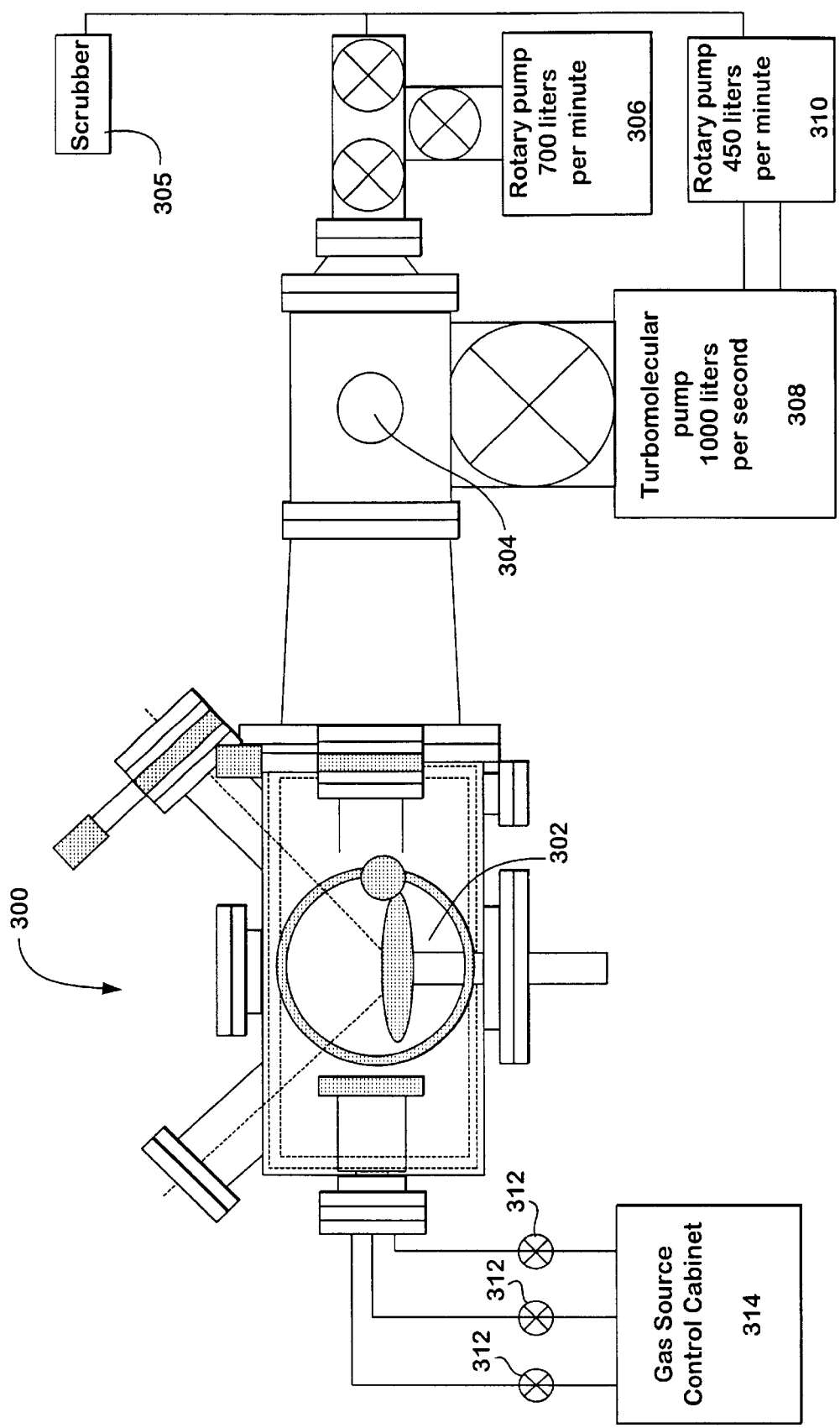
FIG. 3 is a diagram of a reactor chamber in which the GaN semiconductor crystal of an embodiment is grown.

FIG. 3 is a diagram of a reactor chamber 300 in which the GaN semiconductor crystal of an embodiment is grown. The reactor chamber 300 of an embodiment is a double walled chamber having an inside diameter of approximately 14 inches. The reactor chamber 300 includes a cooling system in the main body and the inlet gas body. The cooling system uses water, but is not so limited. The reactor chamber 300 includes at least one port 302 for viewing, loading, and unloading, and at least one pumping port 304. In one embodiment the chamber includes two or more pumping ports 304.

The reactor chamber 300 of an embodiment is formed from ultra low oxygen stainless steel, for example grade 316L or 30316L or S31603 stainless steel or other 316 stainless steel known in the art, in order to reduce or eliminate introduction of impurities during the crystal growing process. The welds used in forming the reactor chamber 300 are performed so that oxygen contamination is prevented in the area of the welds. Furthermore, ultra low oxygen copper gaskets are used in sealing the reactor chamber access ports. In one embodiment, the copper gaskets are used with 316L stainless steel Conflat® flanges and flange components.

The reactor chamber supports pressures as low as $12^{-12}$ Torr, but is not so limited. A staged vacuum system and scrubber 305 are used, wherein rotary pumps 306 generate and/or support pressures as low as approximately $10^{-3}$ Torr. The rotary pumps 306 are rated for 700 liters per minute. Reactor chamber pressures between approximately $10^{-3}$ Tor and $10^{-12}$ Torr are provided using at least one turbomolecular pump 308 and another rotary pump 310. The turbomolecular pump 308 is rated for 1000 liters per second, and the other rotary pump 310 is rated for 450 liters per minute.

The reactor chamber is coupled to a number of gas sources through a number of valves or regulators 312. The gas sources are contained in a gas source control cabinet 314.

The reactor chamber comprises at least one heating unit capable of providing a reactor chamber environment having a temperature of at least 2500 degrees Celsius. In an embodiment, reactor chamber temperature disparity is minimized using a three zone heating unit, but is not so limited. Furthermore, the heating unit is rotatable independently of the reactor chamber up to a speed of approximately 1500 revolutions per minute (RPM), but is not so limited. The heating unit height can be raised or lowered through a range of approximately 0.50 inches to 0.75 inches. The heating elements of the heating unit comprise graphite elements epitaxially coated with silicon carbide or pyro-boron nitride. The pyro-boron nitride material can be commercially obtained.

The first step in growing a GaN semiconductor crystal without a typical base substrate includes growing a nucleation layer. In an embodiment, a Pyro-Boron-Nitride (PBN) susceptor is rinsed with an organic solvent and set in the reactor chamber. The susceptor has a thickness of approximately 3.5 to 4.5 millimeters and a diameter of approximately 5 inches, and is capable of holding three GaN semiconductor wafers, but is not so limited. In a preferred embodiment, the susceptor thickness is 4 mm. The parameterss of the reactor chamber environment are then set and stabilized, parameters including but not limited to pressure, temperature, and rotational velocity.

In setting the parameters of the reactor chamber, the reactor chamber environment is controlled to maintain a selected pressure of between $10^{-3}$ Torr and $10^{-6}$ Torr. In an embodiment, the selected pressure is $10^{-5}$ Torr, but is not so limited. In an embodiment, the selected pressures of the particular process phases, including the nucleation phase and the GaN crystal growth phase, are maintained through the use of the pumps described herein. The reactor chamber environment is heated to a selected temperature in the range of 300 degrees Celsius to 800 degrees Celsius. The reactor chamber temperature is controlled to maintain the selected temperature plus or minus 1 degree Celsius. The reactor chamber is then controllably rotated at 700 RPM plus or minus 50 RPM.

The reactor chamber includes receptacles for receiving a number of gases into the reactor chamber. The gases received in the reactor chamber of an embodiment include Nitrogen ($N_2$), Hydrogen ($H_2$), Ammonia ($NH_3$), Gallium (Ga), Aluminum (Al), and Indium (In), each having a purity of at least 99.99999%.

Upon stabilizing the reactor chamber environment, the surface of the susceptor is cleaned by introducing Nitrogen gas into the reactor chamber. Following this cleaning, the gases used in the nucleation phase are simultaneously introduced into the reactor chamber. The flow rates of the gases are adjusted for the nucleation phase, and the following flow rates are used in an embodiment: Nitrogen is provided at a flow rate of 5 to 10 cubic centimeters per minute; Ammonia is provided at a flox rate of 0.1 to 0.25 liters per minute. Gallium is provided at a flow rate of 0.001 to 0.002 liters per minute; Aluminum is provided at a flow rate of 0.001 to 0.002 liters per minute; and, Indium is provided at a flow rate of 0.001 to 0.002 liters per minute.

A GaN nucleation layer is grown during the nucleation phase for a period of 10 minutes following introduction of the gas mixtures to the reactor chamber. The nucleation layer obtained in an embodiment includes 5 to 30 monolayers having a thickness substantially in the range of 10 Angstroms to 70 Angstroms plus or minus 10 Angstroms. The nominal nucleation layer includes 10 monolayers having a thickness of approximately 25 Angstroms, but is not so limited.

The second step in growing a GaN semiconductor crystal without a typical base substrate includes an interconnection process between the generation of a nucleation layer and the GaN layer growth. The interconnection process is used to stabilize the GaN nucleation layer during a change in the environmental conditions of the reactor chamber.

During the interconnection process, the temperature of the reactor chamber environment is changed at a constant rate of 3 degrees Celsius per minute to a second selected temperature that is appropriate for growth of the GaN layer. This second selected temperature is in the range of 450 degrees Celsius to 1250 degrees Celsius. Upon reaching the second selected temperature, the reactor chamber environment temperature is controlled to maintain the second selected temperature plus or minus 2 degrees Celsius. The reactor chamber environment is controlled to a selected pressure between $10^{-3}$ Torr and atmospheric pressure. The reactor chamber continues to be controllably rotated at 700 RPM plus or minus 50 RPM. The gases continue to be provided using the flow rates of the nucleation phase.

Measurements may be taken of the nucleation layer during the growth of the nucleation layer and the interconnection process, but the embodiment is not so limited. Specific measurements that can be made include thickness and composition using elipsometric methods and instrumentation known in the art. Also, temperature measurement can by made using a pyrometer or other thermal instrumentation known in the art.

Following completion of the interconnection process, the gas flow rates into the reactor chamber are adjusted for the process of growing the GaN layer on the nucleation layer, or the bulk phase. The following flow rates are used in the bulk phase of an embodiment: Nitrogen is provided at a flow rate of 2 to 3 liters per minute; Hydrogen is provided at a flow rate of 2 to 3 liters per minute; Ammonia is provided at a flow rate of 1 to 2 liters per minute; Gallium is provided at a flow rate of 0.2 to 0.5 liters per minute; Aluminum is provided at a flow rate of 0.2 to 0.5 liters per minute; and, Indium is provided at a flow rate of 0.2 to 0.5 liters per minute.

The third step in growing a GaN semiconductor crystal without a typical base substrate includes growing a GaN layer on the nucleation layer. A growth rate of between 20 and 100 micrometers per hour can be achieved, with a nominal growth rate of 100 micrometers per hour. The resultant single bulk crystals produced have dimensions of approximately 2 inches in diameter and a thickness of between 100 to 350 $\mu$m, but are not so limited.

The specifications of the GaN layer obtained as disclosed herein provide many advantages over the typical GaN layer grown on a non-GaN substrate. The lattice structure of the GaN layer is a wurtzite structure. The orientation of the GaN layer is (0001). The thickness of the GaN layer of an embodiment can be greater than 100 micrometers with a thickness uniformity of +/−5 percent, where the best thickness typically found in the prior art is only a few micrometers with a thickness uniformity of +/−10 percent. The dislocation density of an embodiment averages less than $10^5$ per square centimeter. The dislocation density of the prior art averages approximately $10^9$ per square centimeter. The full-width half-maximum intensity of an embodiment as measured using co-scan measurement is less than 100 arc seconds, where that of the prior art is approximately 200 arc seconds.

The GaN semiconductor of an embodiment can easily accommodate uniform n-type doping as a result of the GaN substrate. This GaN substrate makes uniform doping possible prior to fabrication of GaN-based optoelectronic devices because the dopant can be applied directly to the GaN substrate. In an embodiment the GaN substrate is doped with an impurity such as an n-type dopant known in the art. The impurity or dopant can be applied to one or both sides of the GaN substrate. This provides the advantage of allowing for the production of semiconductor devices, LEDS or other optoelectronic devices with doping on both sides of the device. Uniform doping of typical GaN semiconductors having a non-GaN substrate is extremely difficult because the dopant has to be applied to the non-GaN substrate material.

The background donor concentration (Nd—Na) of the GaN layer of an embodiment is less than $10^{16}$ per cubic centimeter. In other embodiments, the background donor concentration can be less than $10^{15}$, $10^{14}$ or $10^{13}$ per cubic centimeter (background donor concentrations can be measured using Hall methods). The best background donor concentrations typically found in the prior art are approximately $10^{18}$ per cubic centimeter. The reduction of the background donor concentration of the GaN layer of an embodiment is a significant improvement because it provides a higher quality GaN crystal and hence improved performance of semiconductors, LEDs or other optoelectronic devices made from GaN material of an embodiment.

Although the claimed invention is described in terms of specific embodiments, it will be understood that numerous variations and modifications may be made without departing from the spirit and scope of the claimed invention as described herein and as set forth in the accompanying claims.

EXPERIMENTAL EXAMPLE

An experimental example of the production of the GaN single crystal includes a single crystal GaN grown by a three step process of creating a nucleation layer on a Pyro-Boron-Nitride susceptor, a second interconnection or stabilization step, and a third step of growing a GaN bulk layer on the nucleation layer. The Pyro-Boron-Nitride susceptor had a thickness of 3.5 to 4.5 mm, and it was cleaned with an organic solvent. The reactor chamber described herein was then evacuated to a pressure of $10^{-9}$ Torr. The temperature was then raised to a temperature in the range 300 to 800 degrees Celsius. The susceptor was rotated relative to the reactor chamber using a rotational velocity of 700 rpm. Chamber conditions were stabilized for ten minutes. The surface of the susceptor was cleaned by introducing 99.9999% pure Nitrogen ($N_2$) gas at a pressure of $10^{-3}$ Torr. Nitrogen ($N_2$) gas was provided at a flow rate of 5 to 10 cubic centimeters per minute; Ammonia ($NH_3$) gas was provided at a flow rate of 0.1 to 0.25 liters per minute; Gallium (Ga) gas was provided at a flow rate of 0.001 to 0.002 liters per minute; Aluminum (Al) gas was provided at a flow rate of 0.001 to 0.002 liters per minute; and, Indium (In) gas was provided at a flow rate of 0.001 to 0.002 liters per minute. A Gan nucleation layer was then grown for a period of ten minutes. The Gan nucleation layer had consisted of 5 to 30 monolayers having a total thickness of ten to 70 Angstroms. Measurements of the nucleation layer were made using an elipsometer. Next, during the stabilization step the chamber was raised to a temperature of 450 degrees Celsius at rate of 3 degrees per minute. The susceptor continued to be rotated relative to the reactor chamber at a rate of 700 rpm. The gas flow rates into the reactor chamber were adjusted for the bulk growth phase. The following flow rates were used in the bulk phase of an embodiment: Nitrogen ($N_2$) gas was provided at a flow rate of 2 to 3 liters per minute; Hydrogen ($H_2$) gas was provided at a flow rate of 2 to 3 liters per minute; Ammonia ($NH_3$) gas was provided at a flow rate of 1 to 2 liters per minute; Gallium (Ga) gas was provided at a flow rate of 0.2 to 0.5 liters per minute; Aluminum (Al) gas was provided at a flow rate of 0.2 to 0.5 liters per minute; and, Indium (In) gas was provided at a flow rate of 0.2 to 0.5 liters per minute. Next, during the bulk growth step, a GaN bulk layer was grown on the nucleation layer at a rate of 20 to 100 micrometers per hour. The final dimension of the bulk crystal was 100 to 350 micrometers in thickness. The resulting film had a (0001) orientation. There was little GaN material in another orientation as determined by X-ray crystallography. The dislocation density was $10^5$ per square centimeter as measured by SEM. The Hall mobility was 300vs/$cm^2$. The background donor concentration(Nd—Na) of the layer was $<10^{16}$ per $cm^3$. The luminescence of the GAN bulk crystal was 3.42 electron volts (eV) at room temperature.

What is claimed is:

1. A nitride semiconductor device comprising:
   a GaN substrate structure formed by growing a GaN nucleation layer on a susceptor, wherein a thickness of the nucleation layer is at least one monolayer, wherein the GaN substrate structure is stabilized; and
   a GaN layer, wherein the GaN layer is grown on at least one surface of the GaN substrate structure using a plurality of gas phase reactants,
   wherein after growth of the nitride semiconductor device, the nitride semiconductor device is removed from the susceptor, the nitride semiconductor device including at least the GaN substrate structure and the GaN layer.

2. The nitride semiconductor device of claim 1, wherein the GaN substrate structure and the GaN layer are grown in a reactor chamber formed from ultra low oxygen stainless steel.

3. The nitride semiconductor device of claim 2, wherein generation of the GaN substrate structure is performed when the environment of the reactor chamber is stabilized and controlled within a first set of environmental parameters, wherein the first set of environmental parameters includes a pressure selected from a range of $10^{-3}$ Torr and $10^{-6}$ Torr and a temperature selected from a range of 300 degrees Celsius and 800 degrees Celsius, wherein the selected temperature is maintained within plus or minus 1 degree Celsius.

4. The nitride semiconductor device of claim 2, wherein growth of the GaN layer is performed when the environment of the reactor chamber is stabilized and controlled within a second set of environmental parameters, wherein the second set of environmental parameters includes a pressure selected from a range of $10^{-3}$ Torr and atmosphere and a temperature selected from a range of 450 degrees Celsius and 1250 degrees Celsius, wherein the selected temperature is maintained within plus or minus 2 degrees Celsius.

5. The nitride semiconductor device of claim 1, wherein the plurality of gas phase reactants comprise gases selected from a group consisting of Nitrogen, Hydrogen, Ammonia, Gallium, Aluminum, and Indium.

6. The nitride semiconductor device of claim 1, wherein growth of the GaN nucleation layer comprises exposing the susceptor to a first gas mixture comprising hydrogen gas, nitrogen gas, ammonia gas, and a second gas mixture comprising at least one group III–V metal alloy.

7. The nitride semiconductor device of claim 1, wherein the nucleation layer comprises 5 to 30 monolayers, wherein the nucleation layer has a thickness dimension approximately in a range of 10 to 70 Angstroms, wherein the GaN layer is grown at a rate between 20 and 100 micrometers per hour, wherein the lattice structure is wurtzite.

8. The nitride semiconductor device of claim 1, wherein the nitride semiconductor device is used in at least one device selected from a group consisting of light-emitting diodes and laser diodes.

9. The nitride semiconductor device of claim 1, wherein the susceptor includes Pyro-Boron-Nitride (PBN).

10. A light emitting device comprising a nitride semiconductor device, the nitride semiconductor device comprising:
- a GaN substrate structure formed by growing a GaN nucleation layer on a susceptor, wherein a thickness of the nucleation layer is at least one monolayer, wherein the GaN substrate structure is stabilized; and
- a GaN layer, wherein the GaN layer is grown on at least one surface of the GaN substrate structure using a plurality of gas phase reactants,
- wherein after growth of the nitride semiconductor device, the nitride semiconductor device is removed from the susceptor, the nitride semiconductor device including at least the GaN substrate structure and the GaN layer.

11. The light emitting device of claim 10, wherein the GaN substrate structure and the GaN layer are grown in a reactor chamber formed from ultra low oxygen stainless steel.

12. The light emitting device of claim 11, wherein generation of the GaN substrate structure is performed when the environment of the reactor chamber is stabilized and controlled within a first set of environmental parameters, wherein the first set of environmental parameters includes a pressure selected from a range of $10^{-3}$ Torr and $10^{-6}$ Torr and a temperature selected from a range of 300 degrees Celsius and 800 degrees Celsius, wherein the selected temperature is maintained within plus or minus 1 degree Celsius.

13. The light emitting device of claim 11, wherein growth of the GaN layer is performed when the environment of the reactor chamber is stabilized and controlled within a second set of environmental parameters, wherein the second set of environmental parameters includes a pressure selected from a range of $10^{-3}$ Torr and atmosphere and a temperature selected from a range of 450 degrees Celsius and 1250 degrees Celsius, wherein the selected temperature is maintained within plus or minus 2 degrees Celsius.

14. The light emitting device of claim 10, wherein the plurality of gas phase reactants comprise gases selected from a group consisting of Nitrogen, Hydrogen, Ammonia, Gallium, Aluminum, and Indium.

15. The light emitting device of claim 10, wherein growth of the GaN nucleation layer comprises exposing the susceptor to a first gas mixture comprising hydrogen gas, nitrogen gas, ammonia gas, and a second gas mixture comprising at least one group III–V metal alloy.

16. The light emitting device of claim 10, wherein the nucleation layer comprises 5 to 30 monolayers, wherein the nucleation layer has a thickness dimension approximately in a range of 10 to 70 Angstroms, wherein the GaN layer is grown at a rate between 20 and 100 micrometers per hour, wherein the lattice structure is wurtzite.

17. The light emitting device of claim 10, wherein the light emitting device comprises at least one device selected from a group consisting of light-emitting diodes and laser diodes.

18. The light emitting device of claim 10, wherein the susceptor includes Pyro-Boron-Nitride (PBN).

19. A composition of matter for a nitride semiconductor device comprising:
- a GaN substrate structure including a GaN nucleation layer on a susceptor, the GaN substrate structure being stabilized, and wherein a thickness of the nucleation layer is at least one monolayer; and
- a GaN layer adjacent the substrate structure, wherein the GaN layer is grown on at least one surface of the GaN substrate structure,
- wherein after growth of the composition of matter, the composition of matter is removed from the susceptor, the composition of matter including at least the GaN substrate structure and the GaN layer.

20. The composition of matter of claim 19, wherein the nucleation layer comprises 5 to 30 monolayers.

21. The composition of matter of claim 19, wherein the nucleation layer has a thickness approximately in the range of 10 to 70 Angstroms.

22. The composition of matter of claim 19, wherein at least one of the nucleation layer or the GaN substrate structure has a wurtzite lattice structure.

23. The composition of matter of claim 19, wherein one of a defect density, a dislocation defect density, or an optical defect density is less than $10^8/cm^2$.

24. The composition of matter of claim 19, wherein one of a defect density, a dislocation defect density, or an optical defect density is less than $10^7/cm^2$.

25. The composition of matter of claim 19, wherein one of a defect density, a dislocation defect density, or an optical defect density is less than $10^6/cm^2$.

26. The composition of matter of claim 19, wherein one of a defect density, a dislocation defect density, or an optical defect density is less than $10^5/cm^2$.

27. The composition of matter of claim 19, wherein an amount of nitrogen vacancies is less than $10^{19}/cm^3$.

28. The composition of matter of claim 19, wherein an amount of nitrogen vacancies is less than $10^{18}/cm^3$.

29. The composition of matter of claim 19, wherein an amount of nitrogen vacancies is less than $10^{17}/cm^3$.

30. The composition of matter of claim 19, wherein the GaN layer has a full-width half maximum intensity of less than 100 arc seconds as measured using an ω-scan measurement.

31. The composition of matter of claim 19, further comprising an impurity.

32. The composition of matter of claim 31, wherein the GaN layer is doped with the impurity.

33. The composition of matter of claim 31, wherein the impurity is a dopant.

34. The composition of matter of claim 31, wherein the impurity is an n-type dopant.

* * * * *